United States Patent
Fain et al.

(10) Patent No.: US 6,459,264 B1
(45) Date of Patent: Oct. 1, 2002

(54) REAL-TIME EMBEDDED MAGNETIC RESONANCE FLUOROSCOPY

(75) Inventors: Sean B. Fain; Stephen J. Riederer, both of Rochester, MN (US)

(73) Assignee: Mayo Foundation For Medical Education and Research, Rochester, MN (US)

( * ) Notice: Subject to any disclaimer, the term of this patent is extended or adjusted under 35 U.S.C. 154(b) by 0 days.

(21) Appl. No.: 09/790,459

(22) Filed: Feb. 22, 2001

(51) Int. Cl.[7] .................................................. G01V 3/00
(52) U.S. Cl. ........................................ 324/307; 324/309
(58) Field of Search .............................. 324/309, 307, 324/306, 312, 314, 300

(56) References Cited

U.S. PATENT DOCUMENTS

| | | |
|---|---|---|
| 4,830,012 A | 5/1989 | Riederer |
| 5,045,791 A | 9/1991 | Yamamoto et al. |
| 5,122,747 A | 6/1992 | Riederer et al. |
| 5,557,203 A * | 9/1996 | Nauerth ...................... 324/309 |
| 5,713,358 A | 2/1998 | Mistretta et al. |
| 5,827,187 A | 10/1998 | Wang et al. |
| 5,912,557 A | 6/1999 | Wilman et al. |
| 5,928,148 A | 7/1999 | Wang et al. |
| 6,023,635 A * | 2/2000 | Liu et al. .................... 324/307 |
| 6,201,985 B1 * | 3/2001 | Polzin et al. ............... 324/309 |

* cited by examiner

*Primary Examiner*—Louis Arana
(74) *Attorney, Agent, or Firm*—Quarles & Brady, LLP

(57) ABSTRACT

An MRI system performs a three-dimensional fast, gradient-recalled echo pulse sequence to acquire NMR data for both 2D and 3D images during a CE-MRA scan. The 2D images may be acquired before, during or after the 3D image acquisition. The 2D images may be reconstructed in real-time and used to control the acquisition of the high resolution 3D image.

21 Claims, 4 Drawing Sheets

US 6,459,264 B1

REAL-TIME EMBEDDED MAGNETIC RESONANCE FLUOROSCOPY

GOVERNMENT LICENSE RIGHTS

The U.S. Government has a paid-up license in this invention and the right in limited circumstances to require the patent owner to license others on reasonable terms as provided for by the terms of CA37993 awarded by the National Institutes of Health.

BACKGROUND OF THE INVENTION

The field of the invention is magnetic resonance angiography (MRA), and particularly the production of real-time images during dynamic studies.

Contrast-enhanced MRA is becoming a widely used technique for imaging the arterial vasculature. With this technique an MR contrast agent such as Gadolinium-DTPA is injected intravenously as a bolus. Some time later when the contrast bolus arrives in the arteries under study the MR data acquisition is performed, typically with 3D spatial encoding. The technique performs well when compared to conventional x-ray angiography (CA) as a screening method for disease in the carotid and renal arteries as well as the major arteries of the leg and foot.

However, 3D CE-MRA remains inferior to intra-arterial CA with respect to both spatial resolution and temporal resolution. Two main acquisition strategies have evolved in 3D CE-MRA to compensate for these detriments. One strategy is designed to maximize spatial resolution. This is based on the acquisition of a single, high resolution 3D image. The success of this strategy depends on the accurate timing of the arrival of the contrast bolus in the targetted vasculature followed by a 10 to 50 sec long acquisition of 3D data during the "first pass" of injected Gd contrast agent. All acquired phase encodes or "views" are unique samples of the spatial frequencies of the object, and therefore all views acquired are dedicated to improving the spatial resolution of the final 3D image. A disadvantage of such a high spatial resolution approach is that it requires a long acquisition time and thus no temporally resolved information is provided since every view is dedicated to improving the spatial resolution of the single resultant 3D data set.

The second strategy in 3D MRA is to sacrifice some of the high spatial resolution of the "timed" single acquisition approach and to acquire a series of lower resolution 3D images during the passage of the contrast bolus. The acquisition of 3D images with higher temporal resolution can be done using techniques such as fractional echo and partial NEX k-space acquisition (i.e. <5/8 NEX), or 3D data sets constructed from multiple samplings of several regions of k-space combined with temporal interpolation as described for example in U.S. Pat. No. 5,713,358.

Yet another strategy is to acquire a sequence of 2D images during the passage of the contrast bolus. This strategy is designed to attain both high temporal resolution (approximately 0.5 to 1.0 Hz) and high in-plane spatial resolution of the contrast passage. In one implementation, 2D projection images are acquired repeatedly, generally with complex subtraction, at rates of 1 image/sec or faster. In order to obtain information over an adequately large and useful vascular region, a thick (several cm) slab is generally imaged. However, because the method is 2D, no resolution is provided along the slab select direction itself. Despite this loss of information along the slab direction, the temporally resolved information provided by such 2D CE-MRA techniques can identify anomalies in contrast enhancement that have functional significance. In a variation of this, the projection angle can be altered or cycled during the acquisition.

What is desirable is a technique which preserves the high spatial resolution in all three dimensions of the single, bolus-timed 3D approach but can still provide dynamic information at the high temporal resolution of the 2D methods.

SUMMARY OF THE INVENTION

The invention comprises an MR imaging technique that makes it possible to acquire high temporal resolution 2D images simultaneous with the acquisition of a high spatial resolution three-dimensional (3D) data set. This is done by including or "embedding" the acquisition of data for 2D imaging within a 3D imaging scan. This invention has particular application to contrast enhanced MR angiography (CE-MRA) where both temporally resolved images capturing the contrast passage through the vascular system and high spatial resolution 3D images are desirable. The invention has further applications when the 2D image sequence is reconstructed in real time. In this case information from the 2D images can be used to modify the 3D acquisition in real-time or to initiate or modify some other process.

Another aspect of the invention is to provide a seamless transition between the acquisition of 2D images and the acquisition of a 3D image. These include fluoroscopically triggered CE-MRA, interventional MR techniques, and moving table-top CE-MRA. This is accomplished by using the same pulse sequence throughout the procedure and exciting the same FOV such that magnetization equilibrium is not disturbed during the transition.

DESCRIPTION OF THE PREFERRED EMBODIMENT

Figure 1:
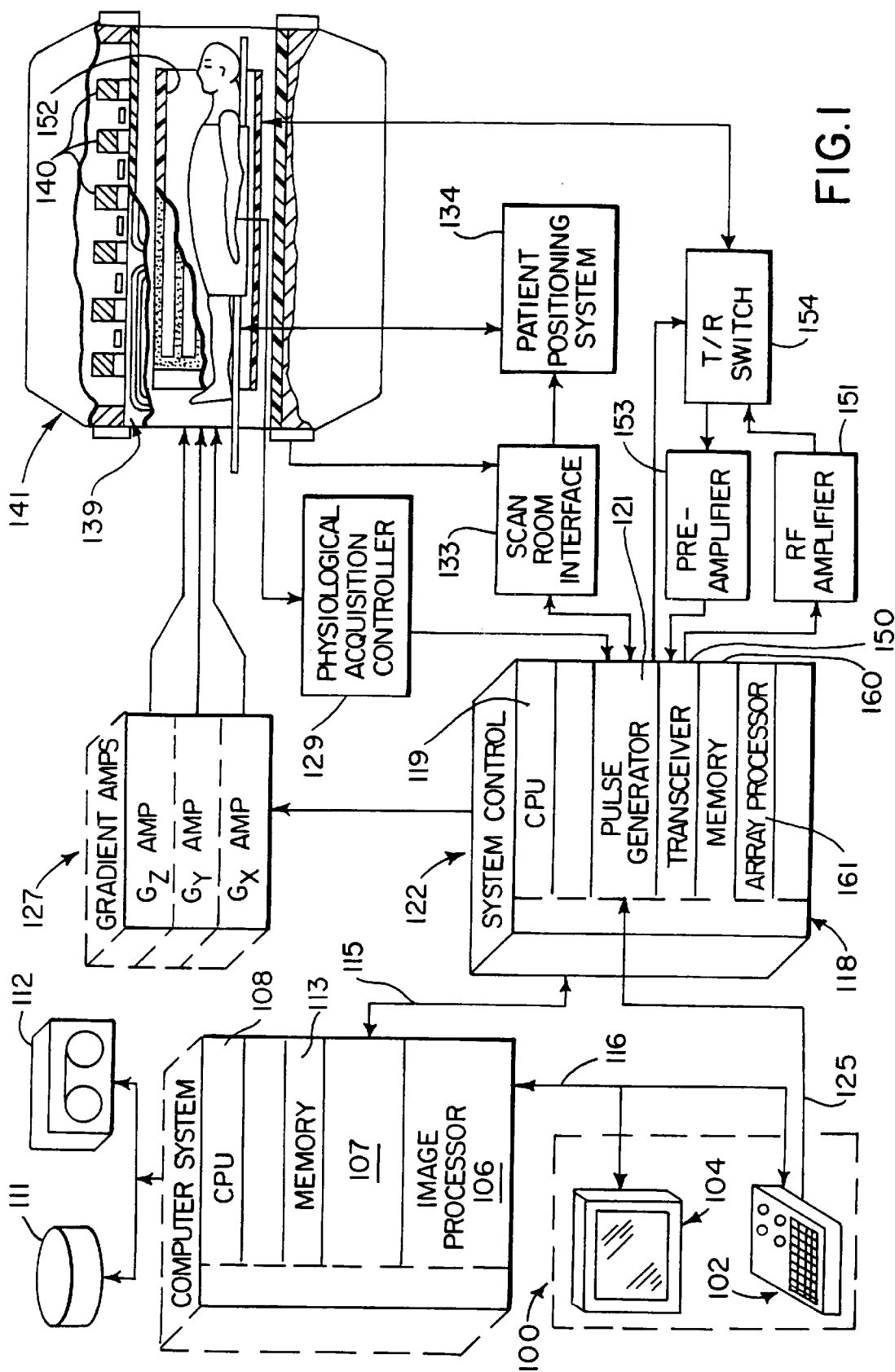
FIG. 1 is a block diagram of an MRI system which may be employed to practice the present invention.

Referring first to FIG. 1, there is shown the major components of a preferred MRI system which incorporates the present invention. The operation of the system is controlled from an operator console which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
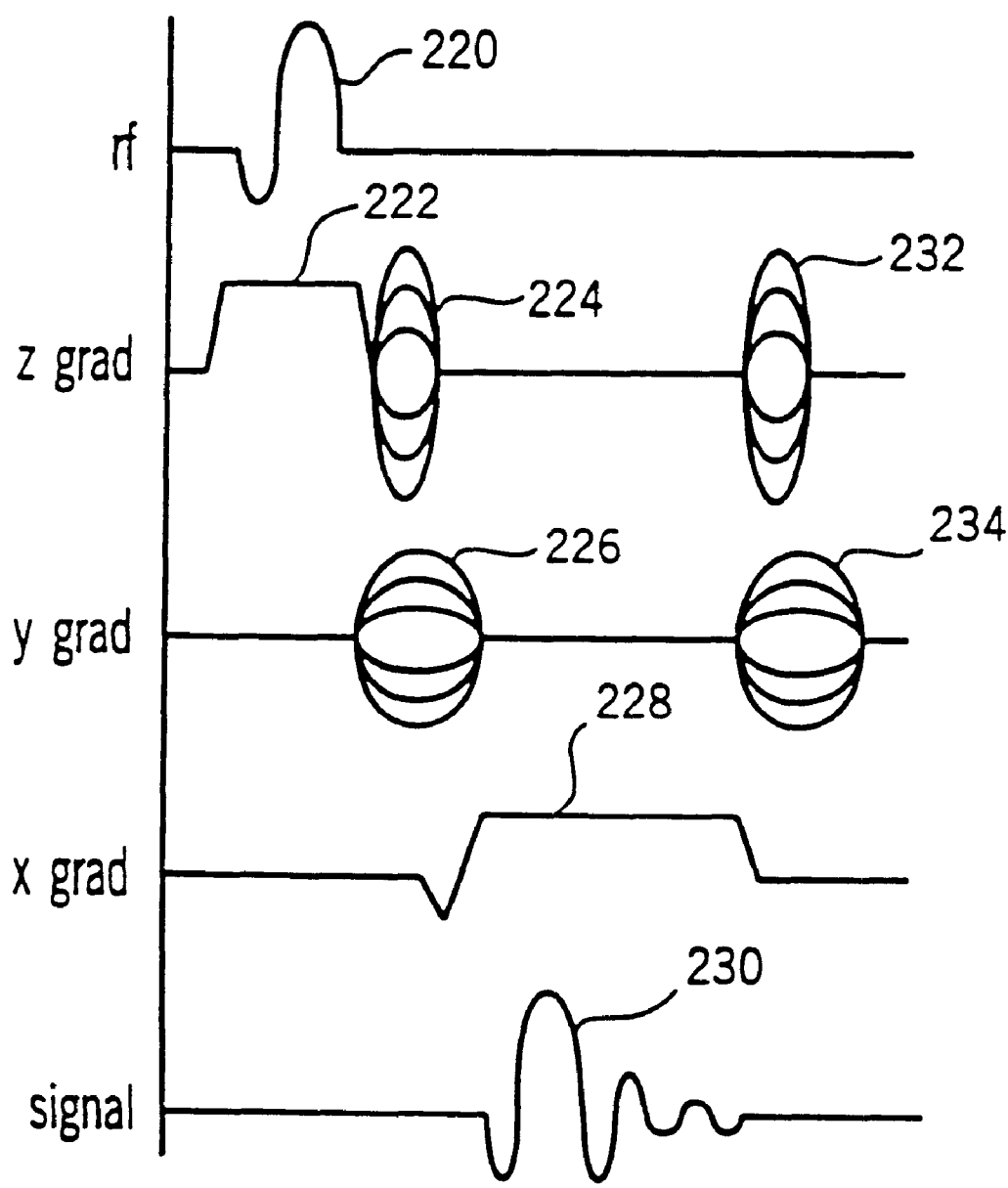
FIG. 2 is a graphic illustration of a pulse sequence which may be employed by the MRI system of FIG. 1 to practice the present invention.

Although the present invention can be used with a number of different pulse sequences, the preferred embodiment of the invention employs a 3D gradient recalled echo pulse sequence depicted in FIG. 2. The pulse sequence "3dfgre" available on the General Electric 1.5 Tesla MR scanner sold under the trademark "SIGNA LX" with revision level 8.3 system software was used.

Referring particularly to FIG. 2, an RF excitation pulse 220 having a flip angle of 45° is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

Figure 3:
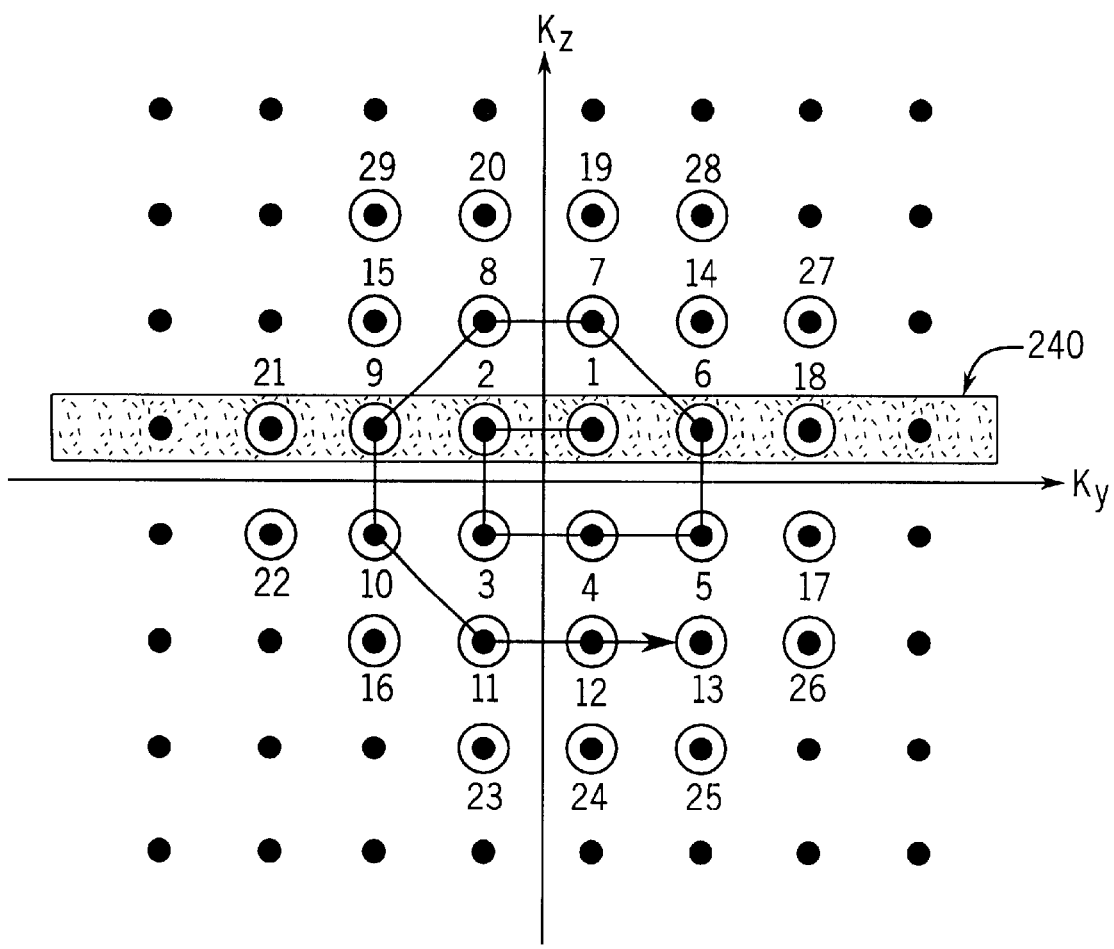
FIG. 3 is a graphic representation of a 3D k-space sampling pattern implemented with the pulse sequence of FIG. 2.

As is well known in the art, the pulse sequence is repeated and the phase encoding pulses 224 and 226 are stepped through a series of values to sample the 3D k-space depicted in FIG. 3. In the preferred embodiment thirty-two phase encodings are employed along the z axis and 192 phase encodings are employed along the y axis. For each particular y phase encoding, therefore, thirty-two acquisitions with thirty-two different z phase encodings are performed to sample completely along the $k_z$ axis. This is repeated 192 times with 192 different y phase encodings to sample completely along the $k_y$ axis. As will become apparent from the discussion below, the order in which this sampling is performed is important.

Sampling along the $k_x$ axis is performed by sampling the NMR echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened to less than 1.8 to 2.0 ms. and the pulse repetition rate (TR) to be shortened to less than 10.0 msecs.

The invention may be used to acquire data for a sequence of 2D images simultaneously with the acquisition of data for a 3D image set. Within the multitude of repetitions of the pulse sequence, the majority of the acquired data continues to be used solely for acquisition of the 3D data. However, a small subset of repetitions are encoded exclusively for 2D imaging, and data from some repetitions can be used for both the 3D and 2D image data sets. The reconstruction process is programmed to select that subset of data encoded for 2D imaging and to reconstruct the temporal sequence of 2D images. This may be done in real-time, in which case, the 2D images are immediately displayed. Similarly, the reconstruction is programmed to select the 3D high resolution image data set and to reconstruct a single, high resolution image at the end of the acquisition.

The initial experimental implementation, and the preferred embodiment, of the technique is one in which the same field of view (FOV) and the same pulse sequence are used for 2D and 3D imaging. Here the field of view is understood to be along the three directions: X (frequency encode), Y (phase encode), and Z (slab select, and partition encode). For the 3D acquisition there are two phase encode directions, Y and Z. For the 2D image sequence, either a small fixed phase encoding or no phase encoding is applied along the slab select direction, and each 2D image in the sequence thus represents the summation of magnetization along the z direction for the entire selected slab. By keeping the same FOV for both the 2D and 3D acquisitions there are no regions of interference due to unequal magnetization histories in either the 2D or 3D images.

In addition to the same FOV, the same pulse sequence is preferably used for both the 2D and 3D acquisitions. In conjunction with a common FOV, this provides for a steady state condition to be reached in which the same magnetization level is excited from one pulse sequence repetition to the next, irrespective of whether the acquired NMR signal in that repetition is earmarked for 2D or 3D data collection.

Under these conditions of common FOV and common pulse sequence the manner in which the embedded 2D fluoroscopy technique is implemented is reduced to how the phase encoding is performed for the individual repetitions of the acquisition. This can be understood by referring to FIG.

3 which shows the acquisition space or "k-space" for an MR data acquisition. In this diagram the kx frequency encoding direction is perpendicular to the page, and thus each pulse sequence repetition is represented as a point, with the location of the point within the $k_y$–$k_z$ plane determined by the phase encoding used for that pulse sequence. The spacing between sample points along a direction ($k_y$ or $k_z$) is equal to the reciprocal of the FOV along that direction. The outermost sample points are determined by the desired spatial resolution, with higher resolution requiring sampling further away from the origin of k-space. Because there are two phase encoding directions, Y and Z, for a 3D acquisition, all locations in the full $k_y$–$k_z$ plane must be sampled. For 2D acquisition the applied phase encoding along the Z direction is fixed for all repetitions, and thus the measurements are all made by sampling along one row of sample points at a fixed $k_z$ as shown in FIG. 3 at 240. In this example, a small non-zero $k_z$ phase encoding is assumed to be applied. In this case the measured signal is still principally a summation of the magnetization along the Z direction of the excited slab.

The acquisition time for collecting a full set of data for the 3D image set is equal to the repetition time (TR) of the pulse sequence multiplied by the product of the number of Y and Z phase encodings required. For 2D imaging the acquisition time is TR multiplied by the number of Y encodings required. These can be expressed as:

$$T_{3D} = TR \cdot Ny \cdot Nz \tag{1a}$$

$$T_{2D} = TR \cdot Ny' \tag{1b}$$

where we have allowed for the number of encodings in the 2D case to be different from that for the 3D case. Although not a requirement, implementation of the embedded fluoroscopy technique will typically use fewer $k_y$ phase encoding steps in the 2D image than the 3D image (i.e., $Ny' \leq Ny$) because the 2D images may be of a lower spatial resolution. From the above equations it is seen that the acquisition time for the 3D data set is markedly longer than for a single 2D image, typically by a factor of Nz or more depending upon the specific Ny and Ny' values used. For example, acquisition of a high resolution 3D image might be 40 seconds long, while a single 2D image might require one second or less.

Referring again to FIG. 3, the embedded fluoroscopy technique is implemented by sampling at all of the points in the full k-space to acquire a complete 3D data set, and to periodically sample at the central row of points 240 to acquire a series of 2D image data sets. The 2D image acquisitions are thus interleaved within the 3D image acquisition. The order in which the phase encoding is performed for the 3D acquisition may be chosen to produce the best 3D high resolution image possible in the particular clinical setting. For example, for 3D CE-MRA a commonly used phase encoding order is one which is "centric" in Y and Z. As described in U.S. Pat. Nos. 5,122,747 and 5,912,557, this centric view order starts at one of the points closest to the k-space origin and then spirals outward out along a sampling trajectory with points sampled in the order of their distance from the origin. Within the playout of this 3D centric view order, pulse sequence repetitions are interleaved which sample along the row of k-space points indicated at 240. This row of k-space sampling 240 is repeatedly acquired as the 3D acquisition is performed to produce a set of 2D image data sets. The frequency of sampling the 2D views within the 3D acquisition, as well as the ordering of these 2D views are chosen to produce the best 2D images for the particular clinical setting and to produce them at the desired frame rate.

Figure 4A:
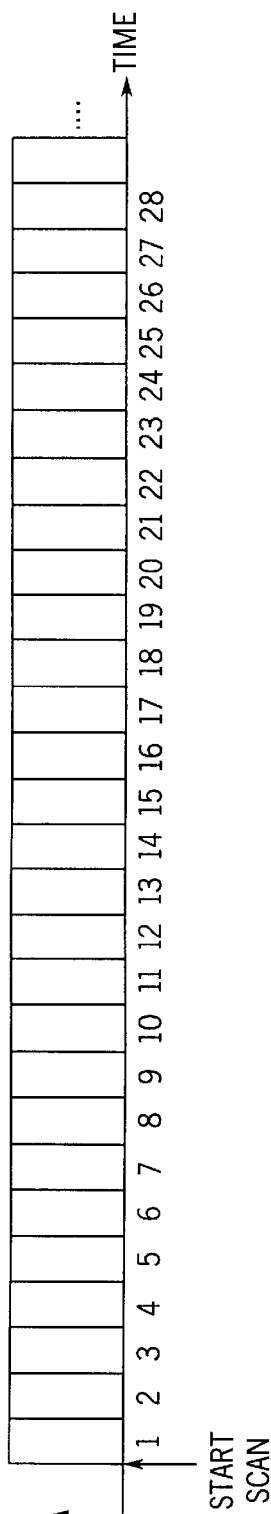
FIGS. 4A and 4B are time lines illustrating how the data is sampled using the pattern in FIG. 3 to practice the preferred embodiment of the invention.

FIG. 4 is a timing diagram for the playout of phase encoding views in an exemplary 3D CE-MRA acquisition. A standard 3D acquisition is shown in FIG. 4A as a reference. This standard 3D acquisition is initiated at the arrival of contrast agent in the arteries of interest and samples are acquired in a centric view order. Referring to the labeled points in FIG. 3, the standard 3D acquisition samples in the order 1, 2, 3, . . . .

Figure 4B:
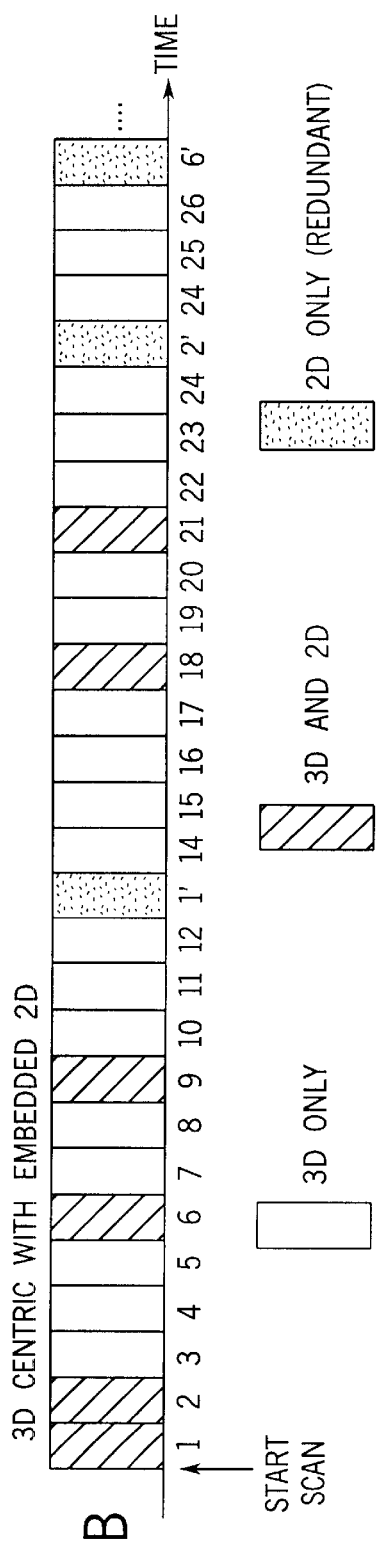

The embedded fluoroscopy technique is illustrated in FIG. 4B. As with the standard 3D acquisition, the combined 3D/2D acquisition is initiated at contrast arrival. Then, in one example implementation, the first nine pulse sequence repetitions sample the points 1–9 of FIG. 3. Conceivably a 2D image could be reconstructed from the views in the row 240, namely from the views at points 1, 2, 6, and 9. These views are identified as "shared" because they can be used to reconstruct both the 2D and 3D images. On the other hand, views at sample points 3, 4, 5, 7, and 8, are specific to the 3D image data set and not the 2D image data set because they fall outside the identified $k_z$ row of data 240. The acquisition continues and conceivably points 10–13 are then sampled and assigned to the 3D image set. During the next pulse sequence repetition, however, one could resample point 1. Call this resampled view 1' and a refreshed 2D image can then be reconstructed using the data from points 1', 2, 6, and 9. This resample of Point 1 is thus embedded within the normal 3D sequence. Because the resampled point 1' need not be used in the formation of the 3D image set (the initial sampling of this point would likely be preferred), it is 2D-specific and is "redundant". Continuing the process, points 14–17 are sampled next and assigned to the 3D data set. Point 18 is then sampled and this can be used along with point 1', 2, 6, and 9 to form a third 2D image. Also because this is the first measurement made at this particular phase encode, this would also be selected for the 3D image set. This is a "shared" 2D/3D view. The process continues until the entire 3D image data set is acquired.

The above description is merely illustrative. The number of phase encodes used in the above example is very small, and such a small number is unlikely to provide adequate spatial resolution. However, the above can clearly be generalized to a larger number. Also, it is possible before initiation of the 3D scan to acquire all of the data necessary to form a 2D image with the full spatial resolution desired. These measurements would then be updated, or refreshed, as described above whenever the same phase encoding points along row 240 are resampled during the 3D acquisition process.

Compared to the acquisition of a single 3D data set, the principal penalty of the embedded fluoroscopy technique is that not all of the available acquisition time is spent in acquiring data which will be used for the 3D image reconstruction. That is, interleaved redundant pulse sequences used solely to acquire 2D image data add to the total scan time. A measure of this penalty is what we call the redundancy (R), which is the percentage of the total number of pulse sequence repetitions which are not used to acquire 3D image data. In the above example, although there is little redundancy at the outset of the scan, eventually approximately one in five pulse sequence repetitions was not used for 3D imaging, a redundancy of 20%. In practice, we target redundancies in the 5% to 15% range which results in a corresponding increase in the total scan time.

Another parameter which defines the embedded fluoroscopy technique is the effective temporal resolution (T) which is the time between complete updates of the 2D image data set. This is given by:

$$T = (N_{cen} \cdot TR)/R \tag{2}$$

where $N_{cen}$ is the number of views required to sample the 2D image k-space (i.e., typically 32 views in a row near the center of k-space). Using this value of $N_{cen}$, and if TR is 5 msec and R is 0.05, then the temporal resolution of the 2D sequence is 3.2 seconds. This 2D image temporal resolution parameter (T) is balanced against both the redundancy parameter (R) and the desired spatial resolution of the 2D imaged determined by $N_{cen}$. Nonuniform sampling may be useful in achieving higher temporal resolution.

Also, multiple 2D perspectives may be obtained during the scan by interleaving sampling along perfect projection planes in the 3D data set. For example, in addition to producing 2D images from views which sample along the $k_z$ axis, two diagonal directions through the 3D data set may also be used to reconstruct 2D images. In fact, redundant samples along these directions could be interleaved with that along the original $k_y$—going row of FIG. 3. This would, of course, require increased redundancy (R) or reduced temporal resolution (T) for each of the plurality of different projection planes.

Another aspect of the invention is the ability to not only acquire 2D and 3D image data sets essentially simultaneously, but also to acquire either 2D or 3D image data and transition "seamlessly" to acquiring the other. Referring to FIG. 3, for example, the pulse sequence of FIG. 2 may be used to rapidly acquire 2D images by sampling the points in the k-space row 240 near the center of k-space. These images may be reconstructed in real-time and used to guide the clinical procedure.

When a high resolution 3D image is to be acquired, a seamless transition is made by sampling the 3D k-space in a sampling trajectory such as that described above and shown in FIG. 3. The seamless transition is made by using the same pulse sequence throughout and not changing the pulse repetition rate. In addition, the same 3D FOV is excited by the RF excitation pulse 220 throughout, and as a result, the magnetization equilibrium established during the succession of 2D image acquisitions is not disturbed during the transition. This means that no equalization period is needed during the transition and no time is lost in acquiring useful image data.

The same is true when transitioning from a 3D acquisition to a 2D acquisition. That is, the same pulse sequence is used and the magnetization equilibrium is not disturbed as the sampling trajectory changes from 3D to 2D. Indeed, 2D data is available from the 3D image data set to enable reconstruction of a 2D image immediately and to enable immediate refreshing of that image as new 2D image data is acquired.

By controlling the redundancy (R) during a scan the acquisition of 2D and 3D images can be controlled to satisfy the needs of the particular clinical application. For example, the scan may have a first phase in which R=100% and only 2D images are acquired at a very high temporal rate (T). The redundancy R may be reduced to 0% to acquire only a 3D image data set or it might be set to 5% to 15% to simultaneously acquire both 2D and 3D data sets as described above. The scan may require that the redundancy be reset to 100% in a final phase to again acquire only 2D images.

There are a number of clinical applications of the embedded fluoroscopy technique. Some of these will now be described and it can be appreciated by those skilled in the art that other clinical applications are also possible.

Direct use of the 2D image sequence in conjunction with the 3D image set. During the acquisition of a 3D CE-MRA image data set of an arterial structure, the 2D image sequence acquired using the embedded technique may be used to provide a "time course" of the contrast bolus during the simultaneous 3D acquisition. This may be used, for example, to show arterial vs. venous enhancement patterns, to display the perfusion through the parenchyma of an organ such as the kidney, or to show contrast flowing through complicated vascular structures such as arteriovenous malformations or dissections. Also, these data could be used to restore the spatial resolution of the 3D image by correcting the time dependent behavior, typically falloff, of the contrast material during the acquisition of the peripheral k-space data.

If the 2D image sequence is reconstructed in real time it is possible to use information in these images to control processes during the scan as described in the following examples.

Use of the 2D data to improve the 3D image acquisition. The embedded fluoroscopy data can be used to update, in real-time, 3D scan parameters such as the flip angle. In 3D CE-MRA, as the contrast bolus concentration wanes immediately after the peak arterial phase, the T1 of the blood increases, and the flip angle which maximizes blood signal (the Ernst angle) then decreases. Flip angle modulation can be used to improve signal during this phase of the acquisition as described in co-pending U.S. patent application Ser. No. 09/198,758 filed on Nov. 24, 1998. If a centric view order is used, the resultant signal-enhanced views will provide improved spatial resolution. Other applications in which embedded 2D data can be used for real-time alteration of the 3D sequence include: tracking of patient motion and adapting or resampling the 3D data to account for such motion;

and timing of late phase, high resolution 3D image sets for CE-MRA.

Use of the 2D data to time or trigger supra-MR acquisition applications. The embedded fluoroscopy data can be used to time or trigger table motion as is relevant for bolus chase imaging of the peripheral vasculature as described in U.S. Pat. No. 5,928,148. The MR scanner table is moved from one station to the next until the embedded fluoroscopic 2D images shows adequate filling of contrast within the vasculature included in the FOV. Also the invention is useful for tracking an intra-arterial catheter or needle to achieve accurate positioning prior to acquiring a high spatial resolution 3D scan. In this application the 2D images are acquired for a period before the 3D acquisition begins and may continue throughout the 3D acquisition and for a time period thereafter.

Seamless MR fluoroscopic triggering of 3D CE-MRA. The combination of embedded fluoroscopy with MR fluoroscopic triggering of 3D CE-MRA has several direct benefits. First, because the same pulse sequence and field of view are used for the 2D fluoroscopic images acquired for triggering, and the acquired 3D image, there is no delay due to download of the 3D sequence. Second, no discarded or "dummy" acquisitions are necessary in the transition between the contrast monitoring phase and the high resolution 3D acquisition because, again, a single pulse sequence and FOV are used for both phases.

Two separate images may be acquired substantially simultaneously for a number of other clinical purposes. For example, two images of substantially different spatial resolution may be acquired at the same time. The low resolution image may be acquired repeatedly and reconstructed and displayed in real-time as a single high resolution image is acquired. Also, two images may be acquired substantially simultaneously using two separate RF coils. For example, one image may be acquired using the whole body RF coil and a second image may be acquired with a local RF coil.

What is claimed is:

1. A method for acquiring data from a subject with a magnetic resonance imaging (MRI) system, the steps comprising:

a) performing a three-dimensional pulse sequence with the MRI system to acquire NMR data which samples points in a line of k-space;

b) repeating step a) a plurality of times to acquire NMR data that samples points throughout a three-dimensional region of k-space;

c) repeating step a) a plurality of times in addition to the repetitions of step b) to acquire NMR data that samples points in a two-dimensional plane within the three-dimensional region of k-space;

d) reconstructing a two-dimensional image from the NMR data that samples points in the two-dimensional plane; and e) reconstructing a three-dimensional image from the NMR data that samples points throughout the three-dimensional region of k-space.

2. The method as recited in claim 1 in which the acquisition of NMR data in step c) is interleaved with the acquisition of NMR data in step b), and a plurality of two-dimensional images are reconstructed.

3. The method as recited in claim 2 in which the reconstruction of two-dimensional images is performed while step b) is being performed to sample throughout the three-dimensional region of k-space.

4. The method as recited in claim 1 in which the two-dimensional plane is located near the origin of k-space.

5. The method as recited in claim 1 in which the reconstruction of the two-dimensional image is performed in real-time.

6. The method as recited in claim 5 in which information derived from the two-dimensional image is employed to control the acquisition of NMR data that samples points throughout the three-dimensional regions of k-space.

7. The method as recited in claim 1 in which step c) is performed before step b) to acquire NMR data from which a plurality of two-dimensional images may be reconstructed prior to acquiring NMR data from which the three dimensional image is reconstructed.

8. The method as recited in claim 7 in which performance of the pulse sequence in step a) includes:

producing an RF excitation pulse that produces transverse magnetization in a volume of interest and the volume of interest remains substantially the same during the performance of steps b) and c).

9. The method as recited in claim 8 in which information derived from the NMR data acquired in step c) is employed to control the acquisition of NMR data in step b).

10. The method as recited in claim 1 which includes:

injecting the subject with a contrast enhancement agent prior to performing step b).

11. A method for performing contrast enhanced magnetic resonance angiography, the steps comprising:

a) placing a subject in a magnetic resonance imaging (MRI) system;

b) injecting a contrast agent into the subject;

c) repeatedly performing a three-dimensional pulse sequence with the MRI system to acquire NMR data from a volume of interest in the subject;

d) controlling the value of gradient field pulses produced by the three-dimensional pulse sequence during a first plurality of said repetitions to sample points in k-space disposed in a two-dimensional plane;

e) controlling the value of gradient field pulses produced by the three-dimensional pulse sequence during a second plurality of said repetitions to sample points in k-space throughout a three-dimensional region that includes said two-dimensional plane;

f) reconstructing a two-dimensional image from NMR data which samples points in the two-dimensional plane; and g) reconstructing a three-dimensional image from NMR data which samples points throughout the three-dimensional region.

12. The method as recited in claim 11 in which the performance of step d) is interleaved with the performance of step e) such that NMR data from which a plurality of two-dimensional images is acquired during the performance of step e).

13. The method as recited in claim 12 in which step f) is performed while step e) is being performed such that two-dimensional images are produced while step e) is being performed.

14. The method as recited in claim 12 in which information derived from the NMR data acquired in step d) is employed to control the performance of step e).

15. The method as recited in claim 11 in which performing the three-dimensional pulse sequence includes:

producing an RF excitation pulse that produces transverse magnetization in spins located throughout the volume of interest and the longitudinal magnetization of spins throughout the volume of interest reaches an equilibrium value which remains substantially constant as NMR data are acquired as set forth in steps c), d) and e).

16. The method as recited in claim 15 in which steps d) and f) are performed for a period prior to performing step e).

17. The method as recited in claim 16 in which step d) is also performed in an interleaved manner while step e) is performed.

18. The method as recited in claim 11 in which step d) is performed in an interleaved manner while step e) is being performed, and the rate at which step d) is performed is determined by a redundancy factor R.

19. A method for acquiring data from a subject with a magnetic resonance imaging (MRI) system, the steps comprising:

a) performing a pulse sequence with the MRI system to acquire NMR data which samples points in a line of k-space;

b) repeating step a) a plurality of times to acquire NMR data with a first RF coil that samples points throughout a region of k-space;

c) repeating step a) a plurality of times to sample points in lines of k-space that are interleaved with the acquisitions in step b) to acquire NMR data with a second RF coil that samples points throughout a region of k-space;

d) reconstructing an image with the NMR data acquired in step b); and e) reconstructing a second image with the NMR data acquired in step c).

20. The method as recited in claim 19 in which the second image is reconstructed a plurality of times during the acquisition of NMR data in step b).

21. The method as recited in claim 20 in which the second image has less spatial resolution than the first image.

* * * * *